United States Patent [19]
Takeuchi et al.

[11] Patent Number: 5,594,292
[45] Date of Patent: Jan. 14, 1997

[54] PIEZOELECTRIC DEVICE

[75] Inventors: Yukihisa Takeuchi, Nishikamo-Gun; Koji Kimura; Mitsuru Kurashina, both of Nagoya, all of Japan

[73] Assignee: NGK Insulators, Ltd., Japan

[21] Appl. No.: 348,252

[22] Filed: Nov. 28, 1994

[30] Foreign Application Priority Data

Nov. 26, 1993 [JP] Japan .................................. 5-296804
Oct. 5, 1994 [JP] Japan .................................. 6-241653

[51] Int. Cl.⁶ .................................................. H01L 41/08
[52] U.S. Cl. .......................... 310/324; 310/328; 310/331; 310/367; 310/369
[58] Field of Search .................................. 310/328, 331, 310/345, 324, 367, 369

[56] References Cited

U.S. PATENT DOCUMENTS

| | | | |
|---|---|---|---|
| 4,189,734 | 2/1980 | Kyser et al. | 310/331 |
| 4,195,284 | 3/1980 | Hampshire et al. | 340/384 E |
| 4,620,123 | 10/1986 | Farrall et al. | 310/331 |
| 4,642,508 | 2/1987 | Suzuki et al. | 310/321 |
| 4,680,595 | 7/1987 | Cruz-Uribe et al. | 346/140 R |
| 4,719,383 | 1/1988 | Wnag et al. | 310/324 |
| 4,848,643 | 7/1989 | Frische et al. | 228/121 |
| 4,890,370 | 1/1990 | Susumufukuda et al. | 29/25.35 |
| 4,938,742 | 7/1990 | Smits | 604/67 |
| 5,079,472 | 1/1992 | Uhl et al. | 310/332 |
| 5,210,455 | 5/1993 | Takeuchi et al. | 310/328 |
| 5,233,259 | 8/1993 | Krishnaswamy et al. | 310/324 |

FOREIGN PATENT DOCUMENTS

| | | | |
|---|---|---|---|
| 0404082 | 12/1990 | European Pat. Off. | F16K 31/00 |
| 62-213399 | 9/1987 | Japan | H04R 17/00 |
| 2161647 | 1/1986 | United Kingdom | H01L 41/18 |
| WO89/08336 | 9/1989 | WIPO | H01L 41/04 |
| 89/08240 | 9/1989 | WIPO | G01D 15/16 |

*Primary Examiner*—Thomas M. Dougherty
*Attorney, Agent, or Firm*—Parkhurst, Wendel & Burr, L.L.P.

[57] ABSTRACT

A piezoelectric device includes a ceramic substrate having at least one cavity defined by a thin-walled region of the substrate. The thin-walled region has an outer surface provided with at least one piezoelectric transducer and also with a non-operative portion situated adjacent to the piezoelectric transducer such that each piezoelectric transducer surrounds the non-operative portion, or two piezoelectric transducers are arranged on both sides of the non-operative portion.

14 Claims, 9 Drawing Sheets

FIG_2
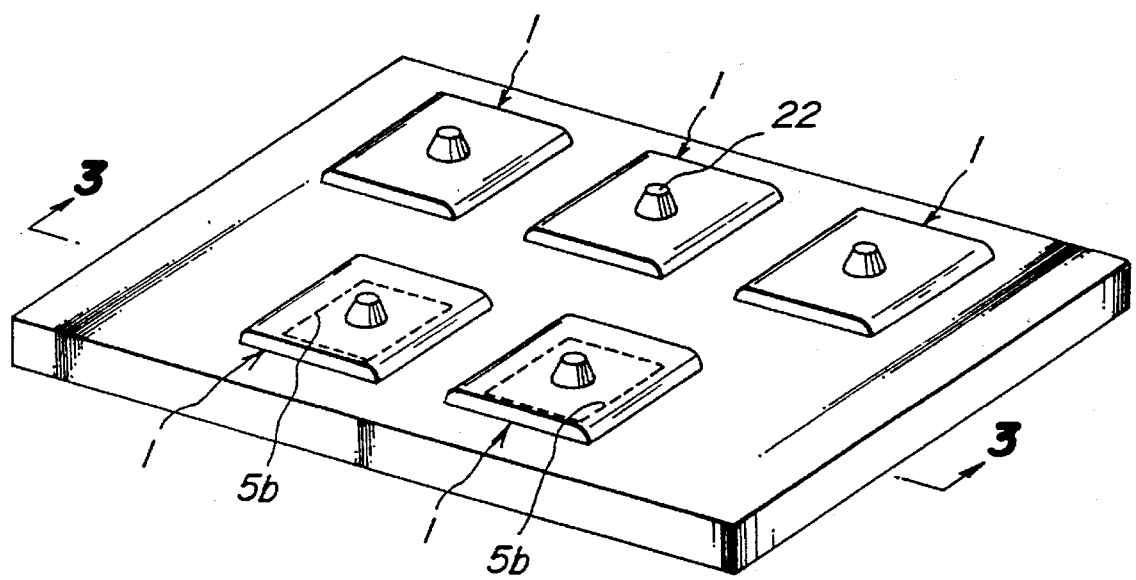
FIG_3
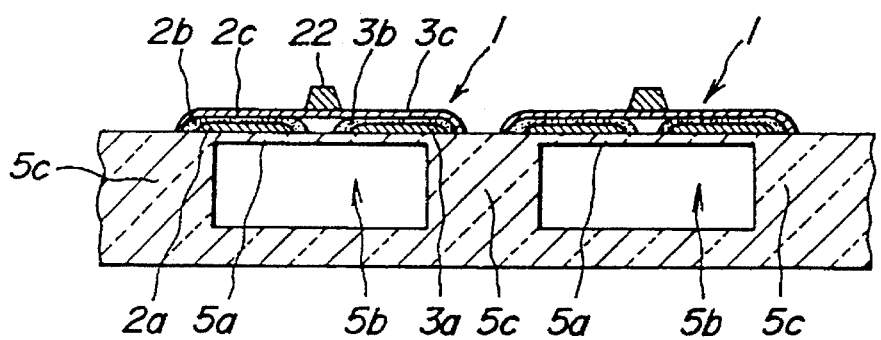

FIG_4A
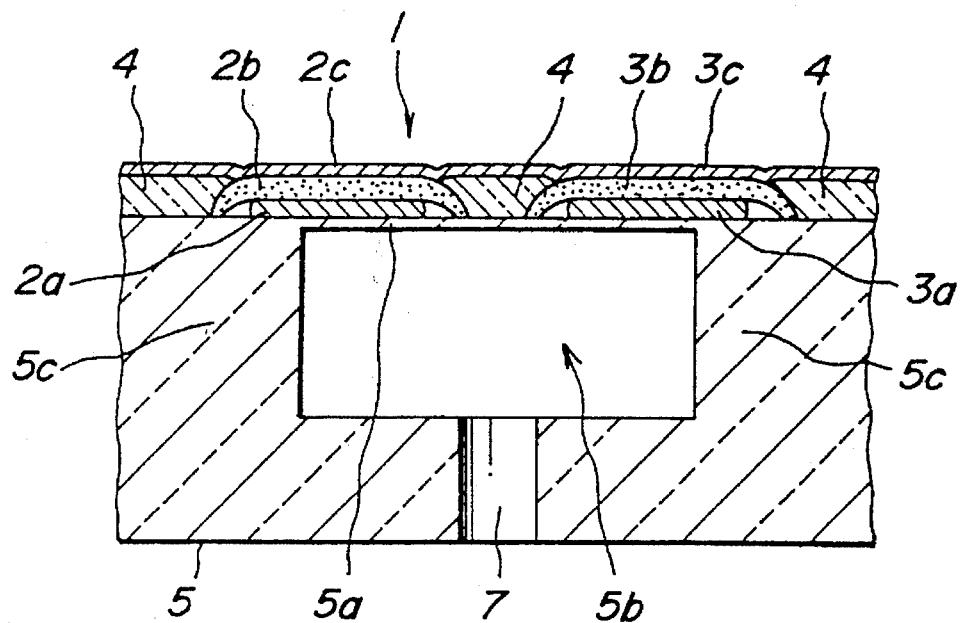
FIG_4B
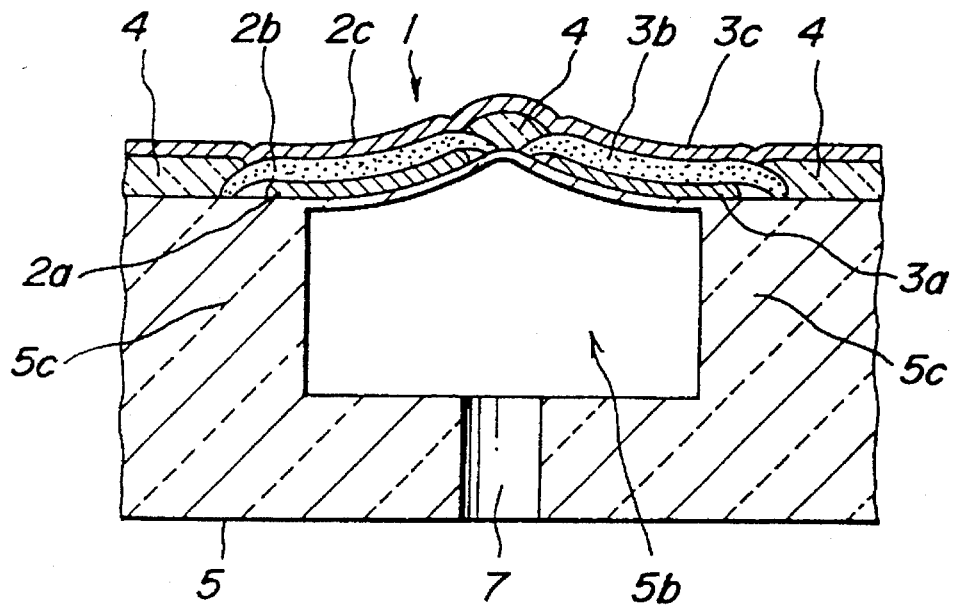

FIG_5A
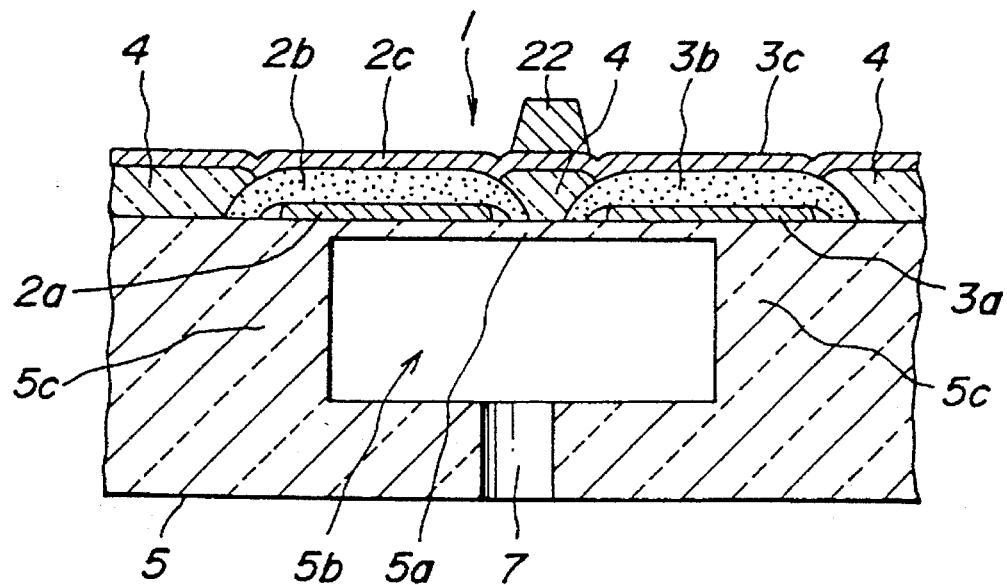
FIG_5B
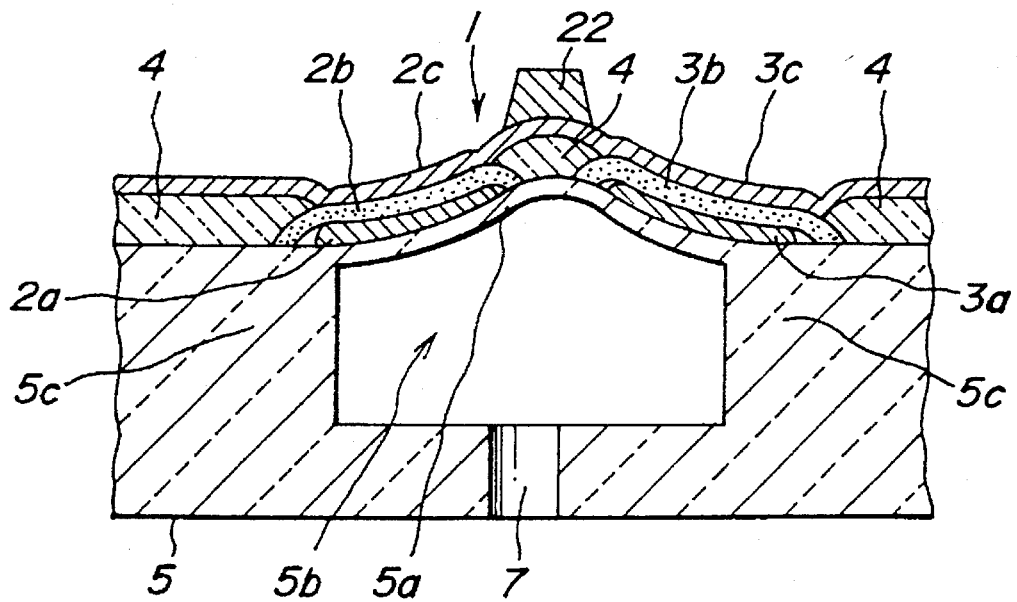

FIG_8
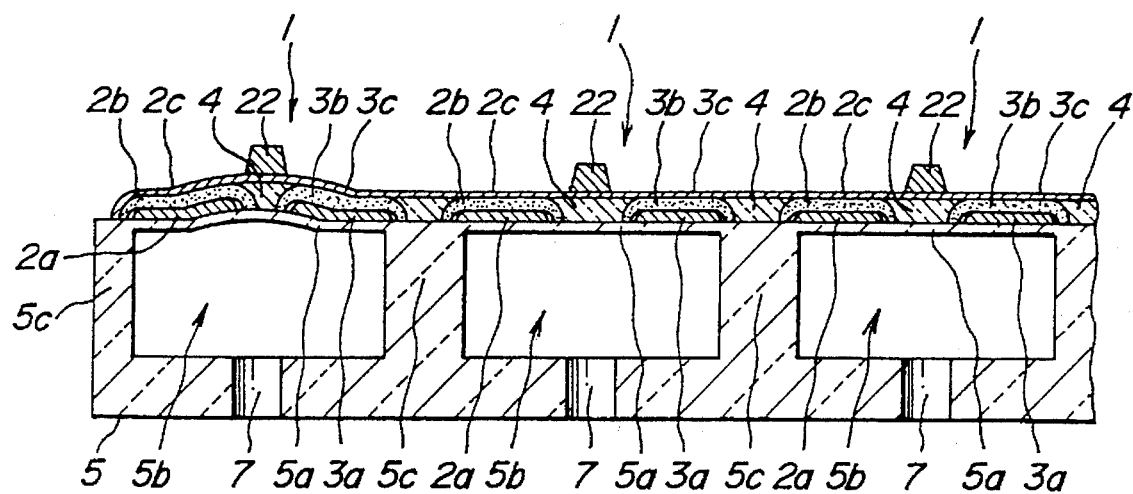
FIG_9
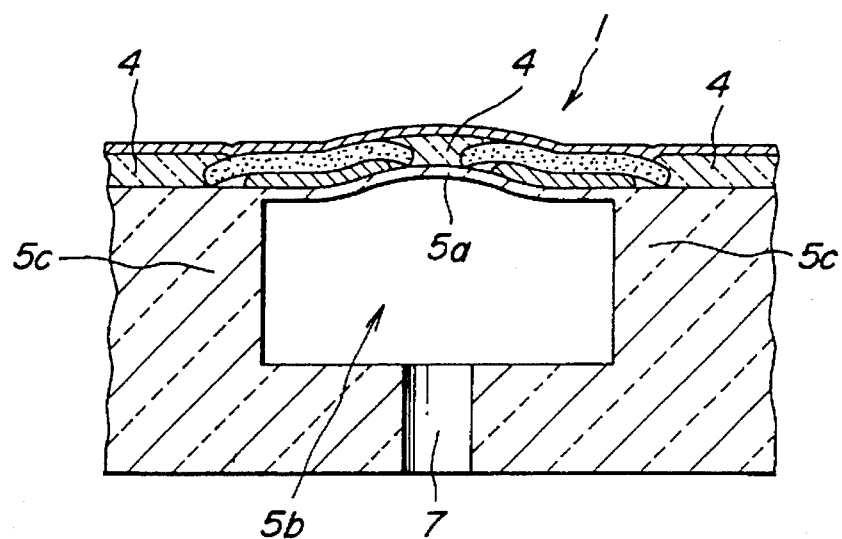

FIG_11
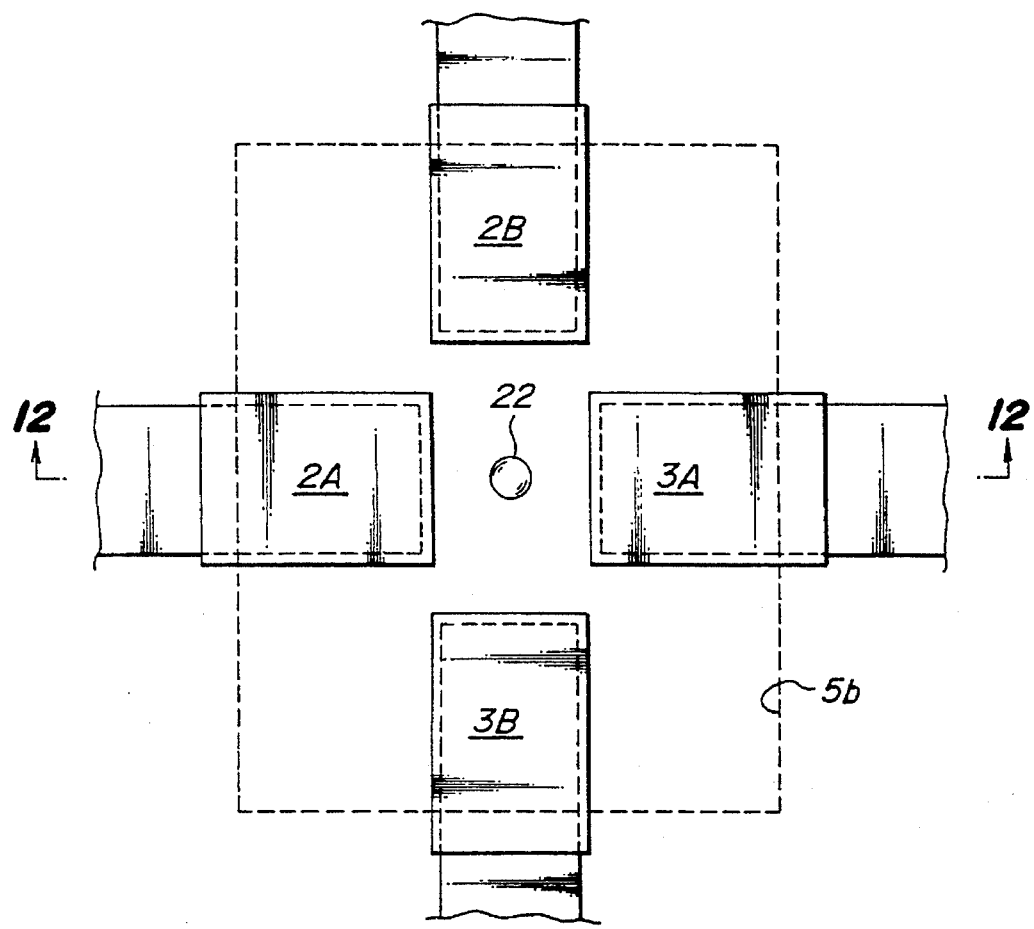
FIG_12
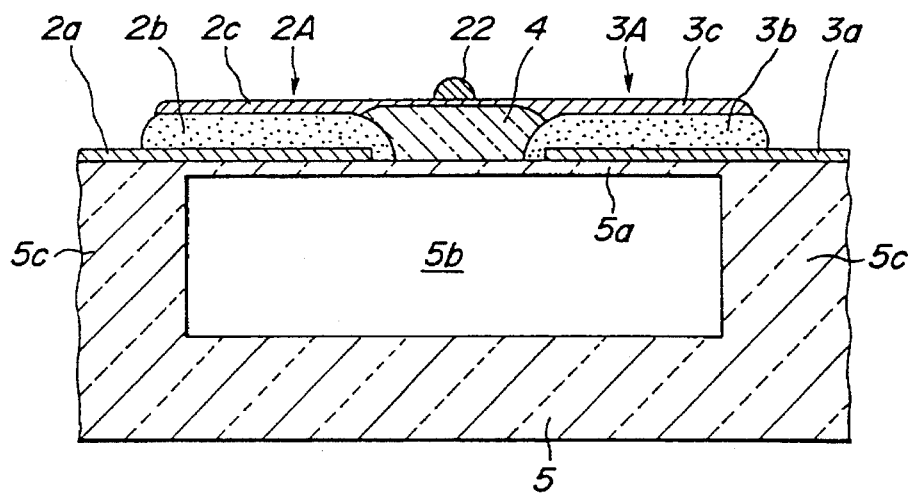

PIEZOELECTRIC DEVICE

BACKGROUND OF THE INVENTION

1. Field of the Invention

The present invention relates to a piezoelectric device for converting an input mechanical quantity into an output electrical quantity, and vice versa.

2. Description of the Related Art

As generally known in the art, piezoelectric devices are typically used to convert an input mechanical stress into an output electric charge (voltage) and also to convert an input electric voltage into an output mechanical strain. In the latter case, the output strain can be used to generate mechanical force, displacement or vibration, and the device is sometimes called as an electrostrictive device. For the sake of convenience, the term "piezoelectric device" as used herein is to be interpreted in its broadest sense as encompassing an electrostrictive device as well. Also unless otherwise noted, the term "piezoelectric material" may be used in its broadest sense as encompassing an electrostrictive material as well.

Conventionally, there have been progressive demands for actuator devices capable of adjusting lengths and/or positions of an optical path on a submicron order, or for sensors capable of detecting fine mechanical displacement as an electric change. In order to satisfy these demands, developments have been made to realize improved actuators or sensors which utilize displacement due to a reverse piezoelectric effect or electrostrictive effect which is caused by an electric field applied to a piezoelectric or electrostrictive material, such as ferroelectric material, and vice versa. In the case of actuators, for example, developments are directed to achieve a compact and less-expensive arrangement of the device which stably operates at a low driving voltage and yet provides a high-speed response characteristic and a satisfactory operational reliability.

Known piezoelectric devices typically include a ceramic substrate having a cavity which is defined by a thin-walled region in the substrate. The thin-walled region of the substrate is provided thereon with a piezoelectric a transducer. Such transducer is comprised of laminated layers including a lower electrode layer, a piezoelectric or electrostrictive layer and an upper electrode layer which are formed one above the other. With such an arrangement of known devices, when a piezoelectric layer comprising a piezoelectric material as opposed to an electrostrictive material is formed between the two electrode layers and the upper and lower electrodes are applied with a voltage having a polarity which is same as that for performing a polarization treatment of the piezoelectric layer, a transverse effect of strain is induced by the applied electric field and causes the piezoelectric transducer to deflect toward the cavity. Alternatively, when an electrostrictive layer comprising an electrostrictive material is formed between the two electrode layers and the upper and lower electrodes are applied with a voltage, the electrostrictive transducer is caused to deflect toward the cavity, notwithstanding the polarity of the applied voltage.

When the above-mentioned known piezoelectric device is to be used as an actuator for a relay, the piezoelectric transducer is provided with a contact on its upper electrode layer. For driving the transducer in a direction toward the contact, i.e., away from the cavity, when the layer between the two electrode layers is comprised of a piezoelectric material as opposed to an electrostrictive material, the upper and lower electrodes have to be applied with a voltage having a polarity which is opposite to that used for a polarization treatment of the piezoelectric layer. In this instance, however, the voltage has to be limited to a level which is smaller than a coercive field which causes the reverse polarization. Thus, not only a sufficient displacement amount cannot be achieved, but also the displacement itself becomes unstable. Alternatively, when the layer between the two electrode layers is comprised of an electrostrictive material, it is impossible to perform a polarization treatment thereby to determine the polarization direction. Consequently, the driving direction of the transducer is always toward the cavity even when the polarity of the applied voltage is reversed, and it is thus impossible to drive the transducer in an opposite direction away from the cavity.

It is of course possible to cause displacement of the transducer in a direction away from the cavity, by utilizing a reaction force of the transducer as it returns to the initial position after being driven toward the cavity. In this instance, however, it is difficult to control the displacement amount and speed of the transducer. Also, the piezoelectric transducer can be driven in a direction away from the cavity, by forming the transducer on the inner surface of the thin-walled region in the substrate. However, particularly due to the cavity structure of the ceramic substrate, the transducer cannot be readily formed on the inner surface of the thin-walled region.

Besides, in the case of the above-mentioned arrangement of piezoelectric devices, due to possible manufacturing tolerance during the production steps, the piezoelectric transducer may be formed at a location slightly offset from the center of the thin-walled region of the ceramic substrate. In this instance, the displacement of the transducer is significantly influenced by the rigidity of the relatively thick-walled region of the substrate adjacent to the thin-walled region, and the displacement amount becomes smaller at a portion of the transducer which is situated closer to the thick-walled region. Therefore, such a piezoelectric device cannot effectively achieve a proper displacement amount even in combination with various auxiliary measures.

DISCLOSURE OF THE INVENTION

It is therefore one object of the present invention to provide a novel piezoelectric device wherein the piezoelectric transducer can be driven in a direction away from the cavity in the ceramic substrate, with stably controlled displacement amount and force.

It is another object of the present invention to provide a novel piezoelectric device wherein the displacement amount of the transducer or change in volume of the cavity can be stably maintained even when the piezoelectric transducer is formed at a location offset from the center of the thin-walled region of the ceramic substrate.

According to the present invention, there is provided a piezoelectric device which comprises a ceramic substrate formed with a cavity defined by a thin-walled region of the substrate, said thin-walled region having an outer surface which is provided with at least one piezoelectric transducer and also with an inactive or non-operative portion situated adjacent to said transducer.

With the above-mentioned novel arrangement of the piezoelectric device according to the present invention, when an operational voltage is applied to the upper and lower electrode layers of the piezoelectric transducer such that the polarity of the applied voltage is same as that for the polarization treatment of the piezoelectric layer, a transverse effect of strain induced by the electric field is caused in the piezoelectric layer so that the piezoelectric transducer tends to deflect downwards, i.e., toward the cavity in the ceramic substrate. However, the thick-walled region of the substrate surrounding the cavity prevents the downward deflection of the edge portion of the piezoelectric transducer situated adjacent to the thick-walled region. Consequently, the edge portion of the piezoelectric transducer situated adjacent to the non-operative portion is lifted upwards, i.e., away from the cavity, with the opposite edge portion adjacent to the thick-walled region as a fulcrum, so that the piezoelectric transducer as a whole is displaced away from the cavity.

The piezoelectric device according to the present invention can be advantageously used as an actuator for a relay. Such an actuator may be of the type disclosed in a publication "Piezoelectric/electrostrictive actuators; from basis to applications", authored by Kanji Uchino, edited by Japan Industrial Technology Center, and published by Morikita Publishers. Also, the piezoelectric device according to the present invention can be advantageously used as a pumping element or a sensor.

The piezoelectric device according to the present invention may be provided, on the outer surface of the thin-walled region, with at least one piezoelectric transducer which surrounds the inactive portion.

Alternatively, however, the outer surface of the thin-walled region may be provided with two piezoelectric transducers with the inactive portion situated between the piezoelectric transducers. In this instance, the piezoelectric transducers may be comprised of two lower electrode layers formed on said outer surface of the thin-walled region and spaced from each other, two piezoelectric layers formed on the lower electrode layers, and at lease one upper electrode layer formed on the piezoelectric layers.

Each of the lower electrode layers may have an edge which extends over a thick-walled region of the ceramic substrate which surrounds the cavity.

The ceramic substrate may have a thick-walled region adjacent to the thin-walled region, said upper electrode layer having an edge which extends over the thick-walled region.

The ceramic substrate may comprise zirconium oxide as a main component, said zirconium oxide having a completely stabilized or partially stabilized crystal phase. In this instance, the zirconium oxide may be stabilized by addition of at least one member selected from a group consisting of yttrium oxide, cerium oxide, magnesium oxide and calcium oxide.

The piezoelectric layer may comprise a material with a major component which comprises a mixture of lead magnesium niobate, lead zirconate and lead titanate, or a mixture of lead nickel niobate, lead magnesium niobate, lead zirconate and lead titanate.

Advantageously, the thin-walled region of the ceramic substrate has a thickness which is not greater that 50 μm.

BRIEF DESCRIPTION OF THE DRAWINGS

FIGS. 2 and 3 show an isometric view and cross-sectional view of a second embodiment of the present invention;

FIGS. 4A and 4B are cross-sectional views showing the manner in which embodiments 1 and 2 operate;

FIGS. 5A and 5B are similar to FIGS. 4A and 4B, but show operation of an embodiment having offset piezoelectric transducers;

FIG. 8 is a cross-sectional view of a fifth embodiment of the present invention;

FIG. 9 is a cross-sectional view of a sixth embodiment of the present invention;

FIGS. 11 and 12 show a top view and cross-sectional view of an eighth embodiment of the present invention.

DESCRIPTION OF THE PREFERRED EMBODIMENTS

Figure 1:
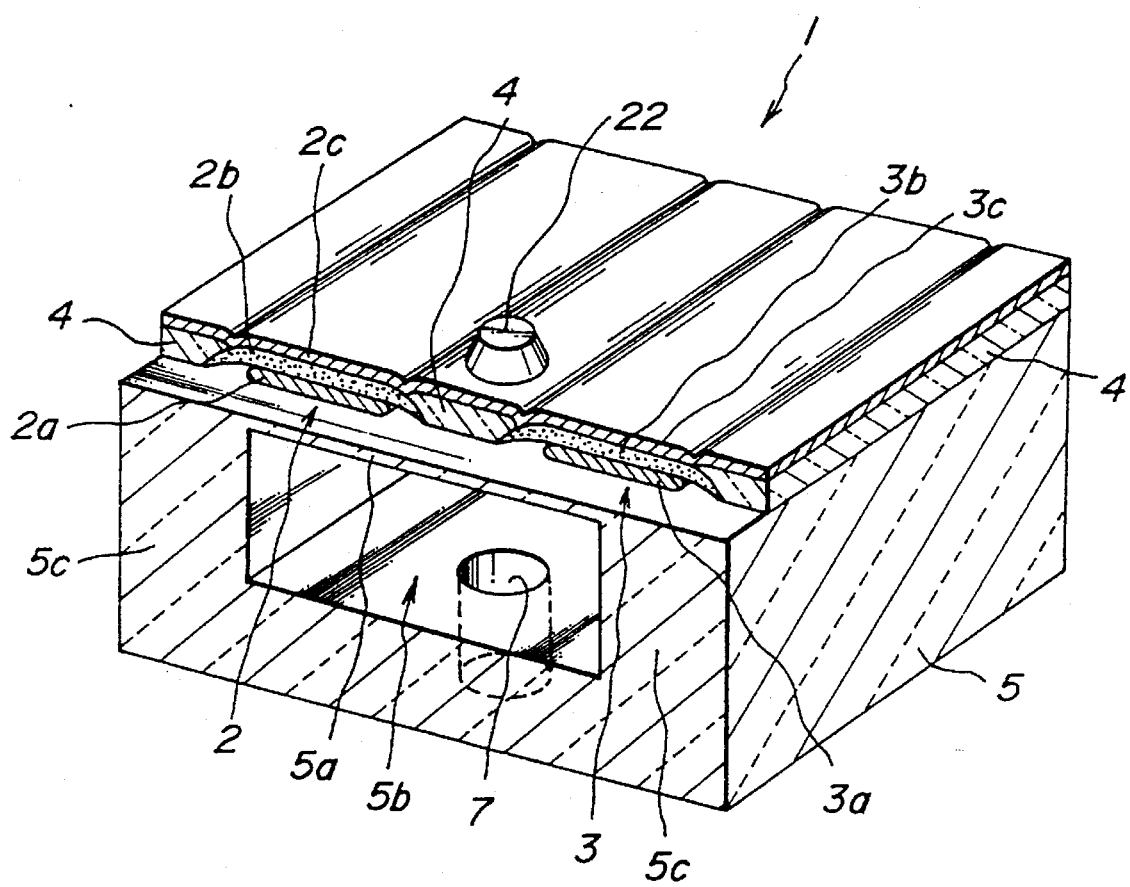
FIG. 1 shows in isometric section view a first embodiment of the present invention.

Referring now to FIG. 1, there is shown a piezoelectric device according to a first embodiment of the present invention which is generally denoted by reference numeral 1. The device 1 according to the present embodiment includes a pair of piezoelectric transducers 2, 3 which are provided on a ceramic substrate 5. Specifically, the ceramic substrate 5 includes a thin-walled region 5a and a cavity 5b having a bottom which is formed by the thin-walled region 5a. The piezoelectric transducers 2, 3 are provided on the outer surface of the thin-walled region 5a. For the sake of convenience, those regions 5c of the ceramic substrate 5 which are situated on both sides of the thin-walled region 5a and the cavity 5b may be referred to as thick-walled regions.

The piezoelectric transducer 2 is comprised of a lower electrode layer 2a formed on the outer surface of the thin-walled region 5a, and a piezoelectric layer 2b and an upper electrode layer 2c are both sequentially formed on, and laminated with the lower electrode layer 2a. Similarly, the piezoelectric transducer 3 is comprised of a lower electrode layer 3a formed on the outer surface of the thin-walled region 5a, and a piezoelectric layer 3b and an upper electrode layer 3c are both sequentially formed on, and laminated with the lower electrode layer 3a.

The piezoelectric transducers 2, 3 have their respective one edges of the lower electrodes which extend over the thick-walled regions 5c on the ceramic substrate 5. The lower electrode layers 2a, 3a of the piezoelectric transducers 2, 3 are arranged with respect to each other, leaving a predetermined distance therebetween. Resin layers 4 are arranged between the ceramic substrate 5 and the upper electrode layers 2c, 3c, along the edges of the piezoelectric layers 2b, 3b. These resin layers 4 provide an electrical insulation and thereby improve the operational reliability of the piezoelectric device 1.

In the embodiment shown in FIG. 1, the upper electrode layers 2c, 3c of the piezoelectric transducers 2, 3 are formed as a unitary layer. The piezoelectric device 1 may be used as a pump unit for a fluid, for example, by forming a through hole 7 in the substrate 5. In this connection, adjacent cavities 5b may be maintained in communication with each other via communication passages in the partition walls between the cavities 5b, i.e., in the thick-walled portions 5c of the substrate 5 so that fluid can flow from one cavity 5b to the other. Furthermore, the piezoelectric device 1 may also be used as an actuator of a relay. In this instance, a contact element 22 may be provided on unitary upper electrode layer at an appropriate location which is preferably situated between the two piezoelectric transducers 2, 3. Alternatively, the upper electrode layer itself may be used as a contact element.

It is of course that when the piezoelectric device 1 is used as a pumping element or a sensor, it is unnecessary to provide the contact element 22 on the upper electrode layer. Likewise, when the piezoelectric device 1 is used as an actuator for a relay, formation of the through hole 7 is not a prerequisite condition.

FIGS. 2 and 3 show a second embodiment of the present invention which is essentially the same as the above-mentioned first embodiment but differs therefrom in that a plurality of piezoelectric devices 1 are integrally formed on a common ceramic substrate 5, by forming a plurality of cavities 5b in the ceramic substrate 5 and providing a plurality of pairs of piezoelectric transducers 2, 3 on the substrate 5.

The operation of the piezoelectric device 1 according to the above-mentioned embodiments will be explained below, with reference to FIGS. 4A and 4B.

In the piezoelectric device 1 shown in FIG. 4A, when an operational voltage is applied to the lower electrode layers 2a, 3a and the upper electrode layers 2c, 3c of the piezoelectric transducers 2, 3 such that the polarity of the applied voltage is same as that for the polarization treatment of the piezoelectric layers 2b, 3b, a transverse effect of strain induced by the electric field is caused in the piezoelectric layers 2b, 3b so that the piezoelectric transducers 2, 3 tend to deflect downwards, i.e., toward the cavity 5b in the ceramic substrate 5. However, the thick-walled region 5c of the substrate 5 surrounding the cavity 5b prevents the downward deflection of the edge portions of the piezoelectric transducers 2, 3 situated adjacent to the thick-walled regions 5c of the substrate 5. Consequently, the edge portions of the piezoelectric transducers 2, 3 situated on the thin-walled region 5a of the substrate 5 is lifted upwards, i.e., in a direction away from the cavity 5b, with the opposite edge portions adjacent to the thick-walled regions 5c as fulcrums. As a result, the entire thin-walled region 5a of the substrate 5 provided with the piezoelectric transducers 2, 3 is displaced upwards away from the cavity 5b. Due to the upward displacement of the thin-walled region 5a of the substrate 5, the volume of the cavity 5b is increased thereby generating a negative pressure within the cavity 5b, which can be used for pumping a liquid.

FIGS. 5A and 5B illustrate the operation of the piezoelectric device 1 wherein the piezoelectric transducers 2, 3 are formed at slightly offset locations on the thin-walled region 5a of the substrate 5 so that the intermediate point between the piezoelectric transducers 2, 3 is laterally shifted from the center of the thin-walled region 5a, e.g., toward the thick-walled region 5c on the right side in the figures. In this case, when the operational voltage is applied to the upper and lower electrode layers, it is possible to cause the thin-walled region 5a of the ceramic substrate to displace or deflect upwardly, as shown in FIG. 5B. On this occasion, the displacement amount of the right side piezoelectric transducer 3 is decreased due to an increased overlapping amount of the transducer 3 with reference to the right side thick-walled region 5c. However, the decreased displacement amount of the right side transducer 3 can be compensated by an increased displacement amount of the left side transducer 2 due to a decreased overlapping amount of the transducer 2 with reference to the left side thick-walled region 5c. Thus, it is possible to achieve a sufficient total displacement amount of the thin-walled region 5a of the substrate 5, which is maintained essentially same as the displacement amount achieved by a piezoelectric device wherein the piezoelectric transducers are formed at proper, non-offset locations on the thin-walled region 5a of the substrate 5.

It can be appreciated that formation of a pair of piezoelectric transducers 2, 3 on the thin-walled region 5a of the ceramic substrate 5 is particularly advantageous in that the total characteristics of the piezoelectric device 1 is not significantly influenced by possible dislocation of the transducers 2, 3, and hence the device 1 can be produced with an improved manufacturing yield.

Figure 6:
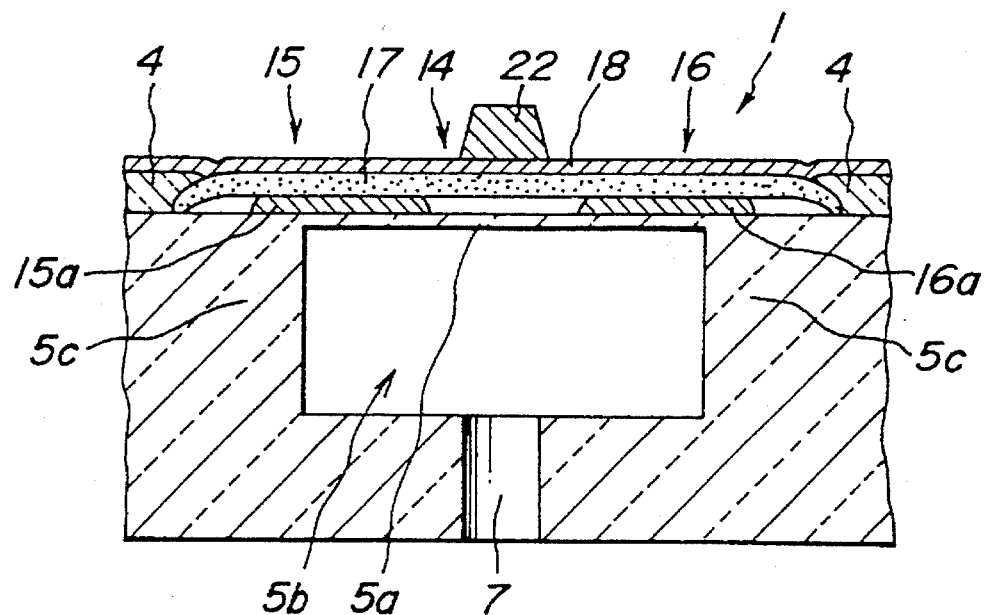
FIG. 6 is a cross-sectional view of a third embodiment of the present invention.

FIG. 6 shows the piezoelectric device 1 according to a third embodiment of the present invention, which differs from the previous embodiments in that the thin-walled region 5a of the ceramic substrate 5 is provided with a pair of piezoelectric transducers 15, 16 which are comprised of individual lower electrode layers 15a, 16a, a common piezoelectric layer 17 and a common upper electrode layer 18 both extending over the lower electrode layers 15a, 16a and adjacent thick-walled regions 5c of the substrate 5. Due to formation of the piezoelectric layer 17 as a single layer, it is possible to facilitate the production of the device and thereby lower the cost. It should be noted, however, that the thin-walled region 5a of the substrate 5 has a relatively high rigidity corresponding to that portion of the piezoelectric layer 17 between the neighboring lower electrode layers 15a, 16a. Therefore, the displacement amount of the thin-walled region 5a is somewhat lower than that achieved by the piezoelectric device wherein individual piezoelectric layers are separated from each other as in the embodiment of FIG. 3, for example.

Figure 7:
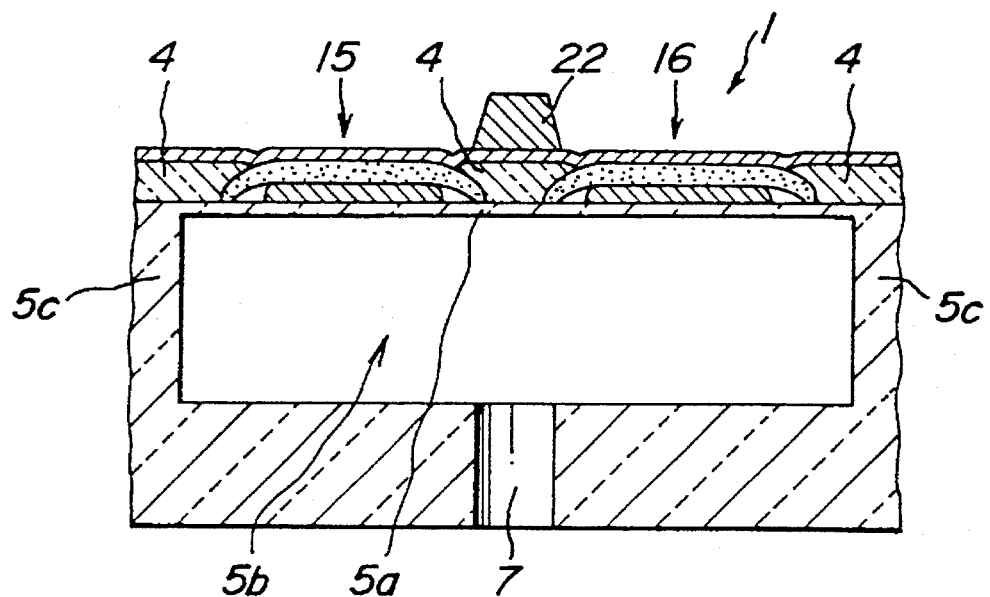
FIG. 7 is a cross-sectional view of a fourth embodiment of the present invention.

FIG. 7 shows the piezoelectric device 1 according to a fourth embodiment of the present invention, wherein the piezoelectric transducers 15, 16 formed on the thin-walled region 5a of the ceramic substrate 5 inclose piezoelectric layers whose edges terminate without extending over the thick-walled regions 5c. In this embodiment also, it is possible to cause the thin-walled region 5a to displace upwardly, i.e., in a direction away from the cavity 5b. In this case, however, the displacement amount of the thin-walled region 5a is somewhat decreased as compared to the piezoelectric device 1 in which the edges of the piezoelectric layers extend over the thick-walled regions 5c.

FIG. 8 shows a fifth embodiment of the present invention, wherein a plurality of cavities 5b are formed in the ceramic substrate 5, each in combination with a piezoelectric device 1 having a basic structure which is substantially the same as that shown in FIG. 1. In this instance, as shown in FIG. 8, only the selected piezoelectric device 1 can be actuated so as to perform the switching function of a relay.

FIG. 9 shows a sixth embodiment of the present invention, wherein the piezoelectric device 1 includes a thin-walled portion 5a of the substrate 5 and a piezoelectric transducer both projecting upwards away from the cavity 5b in their inoperative positions as well. In this instance, it is readily possible to deflect the thin-walled portion 5a of the substrate 5 upwards by a desired amount, even under a low stress condition.

Figure 10:
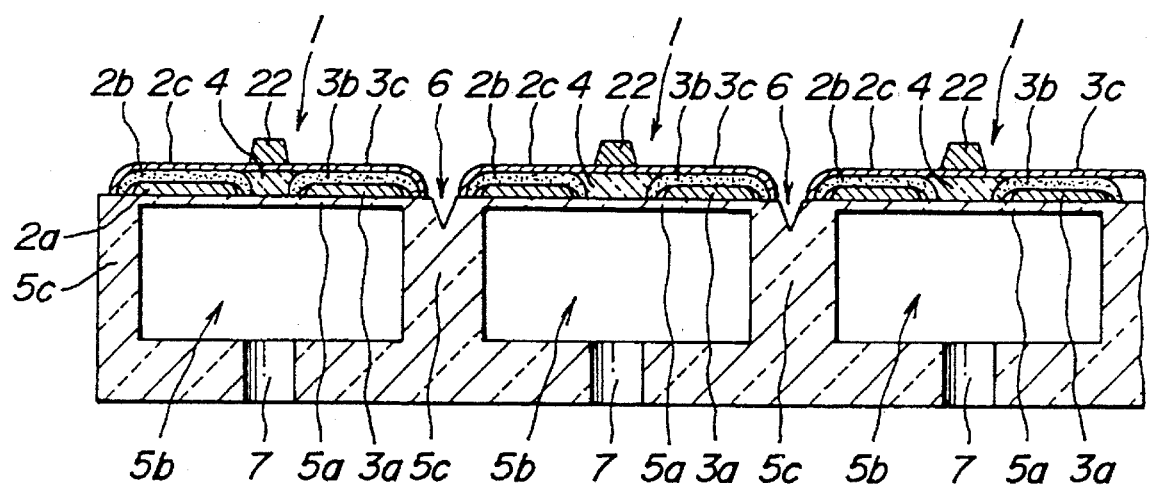
FIG. 10 is a cross-sectional view of a seventh embodiment of the present invention.

FIG. 10 shows a seventh embodiment of the present invention, wherein the substrate 5 is provided with a plurality of piezoelectric devices 1. In this instance, the thick-walled regions 5c of the substrate 5 between the neighboring piezoelectric devices 1 are formed with respective grooves 6 each having a depth which is greater than the thickness of the thin-walled regions 5a. The groove 6 may have a substantially V-shaped cross-section as shown in FIG. 10, or alternatively a square or trapezoidal cross-section. Also, two or more grooves 6 may be arranged between the neighboring transducers.

Such an arrangement of the substrate 5 serves to lower the rigidity of the thick-walled regions 5c of the substrate 5 adjacent to the piezoelectric devices 1 and thereby provide an increased compliance of the thin-walled regions 5a. Thus, despite the difference in the coefficient of thermal expansion of the materials for the substrate and the piezoelectric transducer, the substrate during manufacture of the device can be subjected to the firing shrinkage of the piezoelectric film in a relatively unrestricted sense, thereby minimizing the residual stress in the transducer and assuring highly improved operational characteristics of the device. Moreover, the grooves 6 in the thick-walled regions 5c of the substrate 5 can be advantageously situated between neighboring transducers to provide a low vibration transmissibility of the substrate between adjacent transducers. This serves to effectively eliminate or suppress undesirable interaction or crosstalk between the transducers, and makes it readily possible to uniformly achieve a desired amount of displacement of the thin-walled regions of the substrate in a direction away from the cavity.

Furthermore, as in the embodiment shown in FIG. 1, it is advantageous to form the piezoelectric layer to have a dimension which is sufficient to substantially completely cover the lower electrode layer and to further extend over the ceramic substrate. Such a piezoelectric layer serves to eliminate requirement for a precise alignment of the edges of the piezoelectric layer relative to the edge of the lower electrode layer, for avoiding short circuit between the upper and lower electrode layers.

FIGS. 11 and 12 show an eighth embodiment of the present invention wherein the piezoelectric device 1 includes four piezoelectric transducers 2A, 2B, 3A, 3B on the thin-walled region 5a of the ceramic substrate 5. The cavity 5b in the substrate 5 may have a desired contour, e.g., square contour as can be appreciated from FIG. 11. In this instance, the piezoelectric transducers 2A, 2B, 3A, 3B are arranged to extend over the respective thick-walled regions 5c of the substrate 5 along the four sides of the cavity 5b, and to thereby surround an inactive central portion of the thin-walled region 5a, which may be provided with a resin layer 4. The piezoelectric layers of these transducers 2A, 2B, 3A, 3B may be covered by respective upper electrode layers 2c, 3c or, alternatively, by a single upper electrode layer.

Figure 13:
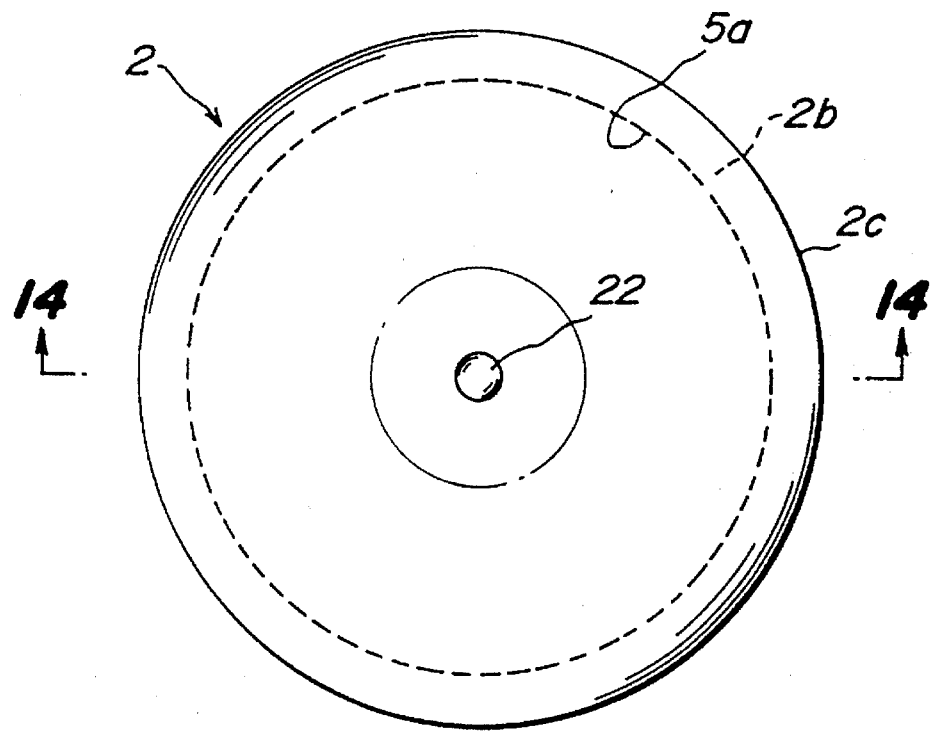
FIGS. 13 and 14 show a top view and cross-sectional view of a ninth embodiment of the present invention.
Figure 14:
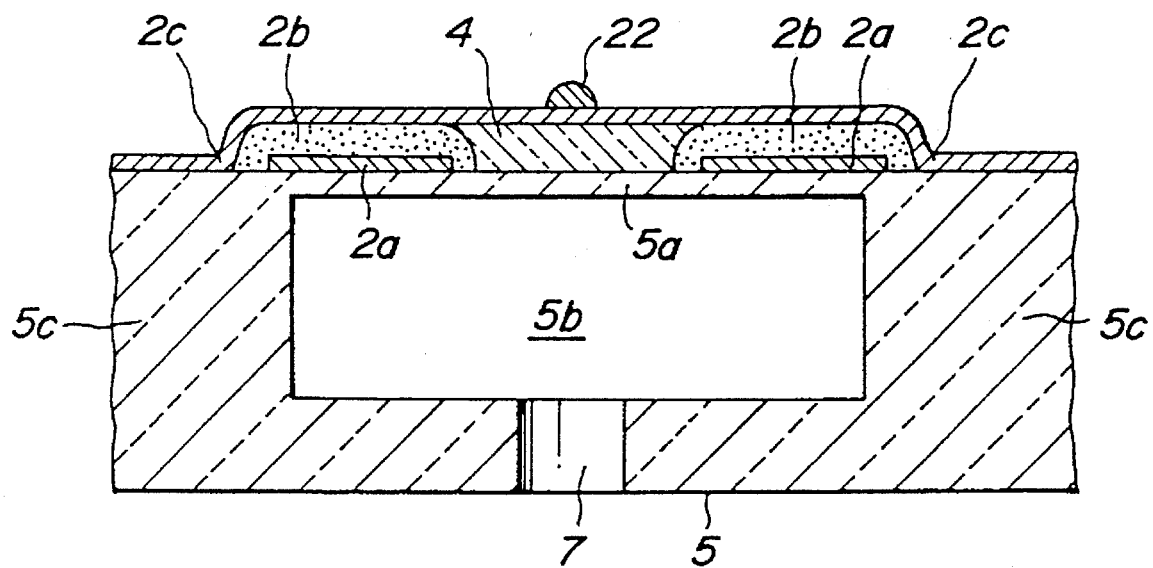

The various embodiments thus far explained each requires the provision of two or more piezoelectric transducers to form a piezoelectric device. However, the present invention is not limited to such embodiments. FIGS. 13 and 14 show a ninth embodiment of the present invention wherein the piezoelectric device 1 includes a single piezoelectric transducer 2 on the thin-walled region 5a of the ceramic substrate 5. The cavity 5b in the substrate 5 may have a desired contour, e.g., substantially circular contour as can be appreciated from FIG. 13. In this instance, he piezoelectric transducer 2 includes an annular lower electrode layer 2a formed on the outer surface of the thin-walled region 5a, and an annular piezoelectric layer 2b formed on, and laminated with the lower electrode layer 2a. The lower electrode layer 2a and the piezoelectric layer 2b surround an inactive central portion of the thin-walled region 5a, which may be provided with a resin layer 4.

As for the thin-walled region 5a of the ceramic substrate 5, in order to provide an improved high speed response characteristic and a high conversion efficiency of the piezoelectric transducer, the thin-walled region 5a has a thickness which is preferably not greater than 50 μm, more preferably not greater than 30 μm, and further more preferably not greater than 10 μm.

The piezoelectric transducer as used in the present invention has a thickness which is generally not greater than 100 μm. Also, in order to provide an improved high speed response characteristic and realize a sufficient displacement amount of the transducer, the piezoelectric layer has a thickness which is preferably not greater than 50 μm, and more preferably not greater than 40 μm and not smaller than 3 μm.

In order to fully utilize the material property of the piezoelectric layer in the device according to the present invention, the ceramic substrate 5 preferably comprises zirconium oxide as a main component, having a crystal phase that has been completely or partially stabilized preferably by the addition of at least one compound selected from a group consisting of yttrium oxide, cerium oxide, magnesium oxide and calcium oxide.

The amount of additives required for partially or completely stabilizing the zirconium oxide as described above may be 1–30 mol % for yttrium oxide, 6–50 mol % for cerium oxide, and 5–40 mol % for the magnesium oxide and calcium oxide. As for yttrium oxide in particular, the amount is preferably 2–4 mol %, because the zirconium oxide added with the yttrium oxide of such amount has a partially stabilized crystal phase and thus exhibits particularly excellent substrate characteristics.

The green sheet for the ceramic substrate 5 may be subjected to sintering at a temperature of 1,000° C. to 1,800° C. prior to formation of the piezoelectric transducer. Alternatively, the green sheet for the ceramic substrate may be subjected to a suitable film-formation process to form the piezoelectric transducer and then sintered. Formation of the piezoelectric transducer on the previously sintered ceramic substrate is often desirable in view of minimization of warp in the final product and dimensional accuracy of the piezoelectric transducer.

A preferred method of forming the ceramic substrate with at least one cavity is to prepare a first green sheet having a desired thickness and formed with at least one recess by using a suitable mold or machining process, such as ultrasonic machining. A second green sheet is further prepared, which is a relatively thin sheet having a thickness corresponding to that of the thin-walled region of the substrate.

A third green sheet is further prepared, which is a bottom sheet for closing the bottom side of he cavity. Thus, the third green sheet has a thickness which corresponds to that of the bottom of the cavity and which is formed with the through hole, as the case may be. The three green sheets are superimposed one above he other under predetermined temperature/pressure condition, such that the first green sheet is sandwiched by the second and third green sheets, and then fired and integrated with each other.

The material for the ceramic substrate may contain a sintering aid, such as clay or the like. In this case, it is desirable to adjust the composition and amount of the sintering aid so that at least the sintered thin-walled region of the substrate does not contain a vitreous material such as silicon oxide, boron oxide, phosphorus oxide germanium oxide, by an amount of 1% or more. This is because an excessive amount of vitreous material often results in undesirable reaction of the substrate material with the piezoelectric material during the heat treatment, making it difficult to control the composition of the piezoelectric material.

In order that the ceramic substrate 5 which has been formed as explained above permits satisfactory operational characteristics of the piezoelectric transducers formed thereon, the surface roughness Ra of the substrate 5 is controlled to be within a range of 0.03–0.9 μm. In this instance, the distortion or stress occurring in the piezoelectric transducer can be effectively transmitted to the substrate 5 having the above-mentioned range of the surface roughness Ra, and vice versa. Such a control of the surface roughness is also elective to assure a high mechanical strength of the relatively thin substrate.

The piezoelectric transducer on the ceramic substrate 5 comprising the upper and lower electrode layers and the piezoelectric layer may be formed by a suitable film-formation process known, per se. That is to say, the film-formation process which may be applied to form the piezoelectric transducer of the device 1 according to the present invention includes a thick-film formation process such as screen printing, spraying, dipping or coating, and a thin-film formation process such as ion beam method, sputtering, vacuum vapor deposition, ion plating, chemical vapor deposition (CVD) or plating. In particular, the thick-film formation process can be advantageously applied to form a film-like piezoelectric layer. This is because the thick-film formation process makes it readily possible to form a film on the ceramic substrate by using a paste or slurry whose major component is powder of piezoelectric ceramic material. In this case, when the powder of piezoelectric ceramic material has an average particle size within a range of 0.01 μm to 5 μm, preferably 0.05 μm to 3 μm, it is readily possible to realize excellent operational characteristics of the piezoelectric device. While the pattern of such a film may be formed by the screen printing method or photolithography method, the pattern may also be formed by removing unnecessary regions of the film by laser cutting, slicing, ultrasonic machining or other suitable machining process.

The present invention is not limited to the specific construction, shape and/or pattern of the piezoelectric transducer illustrated in the drawings. For example, depending upon the utility of the piezoelectric device, the transducer may have triangular, rectangular or other polygonal shape, circular, elliptical or annular shape, comb- or lattice-like pattern, or any combination of these shapes and/or patterns.

The upper and lower electrode layers and the piezoelectric layers formed on the ceramic substrate 5 by a selected method as explained above may be either heat-treated in different steps for integration with the substrate each time a layer has been formed on the substrate, or simultaneously heat-treated in a single step for integration with the substrate after all the layers have been formed into a laminated structure on the substrate. It should be noted in this connection that when a film-formation process is used to form the film layers on the substrate, it is not always a prerequisite condition to carry out the heat-treatment for integrating the film layers with the substrate. Thus, for example, in order to provide an enhanced insulation between the two electrode layers (i.e., the lower and upper electrode layers) on both sides of the piezoelectric film layer, there may be instances wherein a coating of insulation resin or the like is provided on the periphery of the transducer before formation of the electrode layers. In this case, the electrode layers are preferably formed by a process which does not require heat-treatment.

The heat treatment temperature suitable for integrating the film layers of the piezoelectric transducers and the ceramic substrate 5 is generally within a range of 900°–1,400° C., preferably 1,000°–1,400° C. When the piezoelectric film layer is subjected to a heat-treatment, in order to stabilize the composition of the piezoelectric material and avoid undesirable change in the composition in a high temperature condition, the heat-treatment is preferably performed while controlling the atmosphere by heating the vaporization source of the piezoelectric material as well. It is also advantageous to use a method of firing the piezoelectric film layer while it is covered by a suitable cover member for preventing a direct exposure of the piezoelectric film layer to the firing atmosphere. In this case, the cover member consists preferably of a material which is similar to the ceramic substrate material.

The lower electrode layers of the piezoelectric transducer may be formed of any electrically conductive material which can withstand the oxidizing firing and the heat-treatment atmosphere at a considerably high temperature condition as explained above. Thus, the lower electrode layers may be formed of a single metal, an alloy of metals, a mixture of metal or alloy with an electrically insulating ceramic material, or an electrically conductive ceramic material. However, it is preferable to use an electrode material whose major component is a noble metal having a high melting point, such as platinum, palladium, or rhodium, or an alloy such as silver-palladium, silver-platinum, platinum-palladium or the like. It is also preferable to use a cermet material such as platinum and the ceramic material for the substrate, and/or piezoelectric material for the piezoelectric film layer, in view of an improved adhesion of the electrode layers to the piezoelectric film layer and/or the ceramic substrate. However, it is more preferable to use platinum as a major component. As for additive materials to be added to the electrode material, use of vitreous material such as silicon oxide should be avoided because such material tends to react with the piezoelectric material during the heat-treatment thereby deteriorating the characteristics of the piezoelectric device. The amount of the substrate material to be added to the electrode material is preferably 5–30% by volume, and the amount of the piezoelectric material to be added to the electrode material is preferably 5–20% by volume. The material for the upper electrode layer is not limited to the above-mentioned materials, and the upper electrode layer may be comprised of a sputtered film of gold, chromium or copper, or of a printed film comprised of an organometallic compound containing gold or silver.

The lower electrode layer consisting of a conductive material as mentioned above has a thickness which is generally not greater than 20 μm, and preferably not greater than 5 μm. On the other hand, the upper electrode layer consisting of a conductive material as mentioned above has a thickness which is generally not greater than 1 μm, and preferably not greater than 0.5 μm.

The piezoelectric layers may be formed of any piezoelectric material which exhibits a relatively large amount of field-induced strain or displacement when applied with a voltage, due to the piezoelectric effect. The piezoelectric material may be either a crystalline material or an amorphous material, and may be a semi-conductive material or a dielectric or ferroelectric ceramic material. Furthermore, the piezoelectric material may either require an initial polarization or poling treatment or may not require such treatment.

Preferably, however, the piezoelectric materials which can be used in the present invention has a composition whose major component is lead zirconate titanate (PZT), lead magnesium niobate (PMN), lead nickel niobate (PNN), lead manganese niobate, lead antimony stannate, lead zinc niobate, lead titanate, lead zirconate, lead nickel tantalate, lead magnesium tantalate or a mixture or solid solution thereof. Furthermore, the piezoelectric materials indicated above may be added with a suitable amount of additives comprising an oxide or compound of lanthanum, barium, niobium, zinc, cerium, cadmium, chromium, cobalt, antimony, iron, yttrium, tantalum tungsten, nickel, manganese, lithium, strontium, calcium, and/or bismuth. For example, a piezoelectric material whose major component is PZT or the like may be added with lanthanum so as to obtain a material whose major component is PLZT. However, addition of vitreous material such as silicon oxide should be avoided, since lead contained in the piezoelectric materials such as PZT tends to react with the vitreous material, making it difficult to achieve a desired composition of the piezoelectric film layer, hereby causing undesirable fluctuation and deterioration of the operational characteristics of the piezoelectric device.

Among the piezoelectric materials indicated above, it is preferable to use a material of which the major component comprises (i) a mixture of lead magnesium niobate, lead zirconate and lead titanate, or (ii) a mixture of lead nickel niobate, lead magnesium niobate, lead zirconate and lead titanate, or (iii) a mixture of lead nickel tantalate, lead magnesium niobate, lead zirconate and lead titanate, or (iv) a mixture of lead magnesium tantalate, lead magnesium niobate, lead zirconate and lead titanate. It is particularly advantageous to use a piezoelectric material of which the major component comprises a mixture of lead magnesium niobate, lead zirconate and lead titanate. Such a piezoelectric material has a particularly low reactivity with the substrate material during the heat-treatment, and is thus free from segregation of its components. Therefore, not only the edges of the piezoelectric layer extending over the thick-walled region of the ceramic substrate can be maintained in such a bonded state with the substrate for assuring a proper operation of the piezoelectric transducer, but also a desired composition or crystal structure can be readily obtained as a result of a suitable treatment for maintaining the composition. Moreover, such a piezoelectric material has a particularly high piezoelectric constant, and can be used as a material suitable for forming the piezoelectric film layer by the above-mentioned thick-film formation process such as screen printing, spraying, dipping, coating and the like.

While such multi-component piezoelectric material has a piezoelectric characteristic which varies depending upon the composition of components, a three-component material composed of lead magnesium niobate, lead zirconate and lead titanate, which can be suitably used in the invention, preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly advantageous to use a composition containing 15–50 mol % of lead magnesium niobate, 10–45 mol % of lead zirconate and 30–45 mol % of lead titanate.

The piezoelectric transducer comprising the electrode layers and the piezoelectric film layer described above generally has a thickness of 100 μm or less. To assure a relatively large amount of displacement at a relatively low voltage, the piezoelectric film layer has a thickness which is preferably 50 μm or less, more preferably within a range of 3–40 μm.

In the piezoelectric device according to the present invention, the dimension and/or material for the piezoelectric transducers forming a pair on a thin-walled portion of the substrate may be same with each other. However, it is also possible to provide a pair of piezoelectric transducers which are different in dimension and/or material so as to constitute a piezoelectric device which may be used as a filter device or transformer.

In order to confirm advantageous functions of the present invention, there were prepared specimens of the piezoelectric devices having a conventional structure, and specimens of the piezoelectric devices having a basic structure shown in FIG. 1. For each specimen, the ceramic substrate is comprised of zirconium oxide as a major component, having a crystal phase partially stabilized by the addition of yttrium oxide, and is formed with a thin-walled region having a thickness of 10 μm. A lower electrode comprising platinum and having a thickness of 5 μm, and a piezoelectric layer comprising a material whose major component is a composition of lead magnesium niobate, lead zirconate and lead titanate, and having having a thickness of 30 μm, were pattern-formed on the thin-walled region of the ceramic substrate by a screen printing method and then integrated with the substrate by sintering, and an upper electrode layer was comprised of gold and formed by a sputtering process. With these specimens, displacement tests have been performed to measure amount of displacement of the piezoelectric transducer achieved by applying an operational voltage of DC 30 V to the piezoelectric transducer. The measurement was performed by using a laser displacement meter. The result of the measurement is shown in Table 1 below.

TABLE 1

| Type of Specimen | Polarity for polarization | Polarity of operational voltage | Direction of displacement | Displacement amount (μm) |
|---|---|---|---|---|
| Comparative Specimen 1 | positive for upper side | positive for upper side | downward | 0.30 |
| | | negative for upper side | upward | unstable * (max. 0.10) |
| Comparative Specimen 2 | negative for upper side | negative for upper side | downward | 0.22 |
| | | positive for upper side | upward | unstable * (max. 0.08) |
| Specimen 3 of the Invention | positive for upper side | positive for upper side | upward | 0.30 |
| | | negative for upper side | downward | unstable * (max. 0.10) |
| Specimen 4 of the Invention | negative for upper side | negative for upper side | upward | 0.23 |
| | | positive for upper side | downward | unstable * (max. 0.08) |

Note: * . . . The displacement amount changes with time.

As can be recognized from Table 1 above, the piezoelectric device according to the present invention is capable of causing an upward displacement of the piezoelectric transducer with a satisfactory displacement amount which is substantially same as the downward displacement amount of conventional piezoelectric devices which fully utilize the polarization characteristic of the piezoelectric film layer.

It will be readily appreciated from the foregoing detailed description that, according to the present invention, it is possible to realize a piezoelectric device including a thin-walled region of the substrate which can be deflected or displaced upward, i.e., in a direction away from a cavity defined by the thin-walled region, by applying an operational voltage with a polarity which is same as the polarity for polarization treatment of the piezoelectric film layer, thereby causing the volume of the cavity to increase or generate a negative pressure in the cavity. Such an upward displacement of the thin-walled region can be achieved without sacrifice of the polarization characteristic of the piezoelectric film layer and hence the proper characteristics of the device. Moreover, it is possible to improve the manufacturing yield of the piezoelectric device since, even when the piezoelectric transducer is formed at a location which is laterally offset relative to the substrate, the thin-walled region of the substrate can be displaced upward by an amount which is substantially same as that achieved by a piezoelectric transducer situated at a proper location without lateral shifting.

while the present invention has been described with reference to some preferred embodiments, they were given by way of examples only. It is of course that various changes and modifications may be made without departing from the scope of the present invention as defined by the appended claims. For example, although the above-mentioned embodiments of the piezoelectric device are mainly directed to actuators for a relay, the device according to the present invention can also be used as a pumping element or a sensor.

We claim:

1. A piezoelectric device, comprising:
    a ceramic substrate having a cavity partially defined by a thin-walled region, said thin-walled region having an outer surface;
    at least one piezoelectric transducer provided on the thin-walled region; and
    an inactive portion provided on the thin-walled region and adjacent the at least one piezoelectric transducer, wherein in at least one cross-section through the cavity the at least one piezoelectric transducer forms first and second piezoelectric portions spaced apart from each other such that the inactive portion is positioned therebetween.

2. The piezoelectric device of claim 1, wherein said at least one piezoelectric transducer comprises first and second piezoelectric transducers respectively forming said first and second piezoelectric portions.

3. The piezoelectric device of claim 1, wherein said first and second piezoelectric portions are integrated with each other to form a single piezoelectric transducer.

4. The piezoelectric device of claim 3, wherein said single piezoelectric transducer surrounds the inactive portion.

5. The piezoelectric device of claim 1, wherein said inactive portion comprises a resin layer provided between the first and second piezoelectric portions.

6. The piezoelectric device according to claim 2, wherein said piezoelectric transducers are comprised of two lower electrode layers forms on said outer surface of the thin-walled region and spaced from each other, two piezoelectric layers respectively formed on said two lower electrode layer, and at least one upper electrode layers formed on said piezoelectric layers.

7. The piezoelectric device according to claim 6, wherein said ceramic substrate has a thick-walled region surrounding said thin-walled region, said lower electrode layers each having an edge which extends over said thick-walled region.

8. The piezoelectric device according to claim 6, wherein said ceramic substrate has a thick-walled region surrounding said thin-walled region, said upper electrode layer having an edge which extends over said thick-walled region.

9. The piezoelectric device according to claim 1, wherein said ceramic substrate comprises zirconium oxide as a main component, said zirconium oxide having a completely stabilized or partially stabilized crystal phase.

10. The piezoelectric device according to claim 9, wherein said zirconium oxide is stabilized by addition of at least one member selected from a group consisting of yttrium oxide, cerium oxide, magnesium oxide and calcium oxide.

11. The piezoelectric device according to claim 1, wherein said piezoelectric layer comprises a material with a major component which comprises a mixture of lead magnesium niobate, lead zirconate and lead titanate.

12. The piezoelectric device according to claim 1, wherein said piezoelectric layer comprises a material with a major component which comprises a mixture of lead nickel niobate, lead magnesium niobate, lead zirconate and lead titanate.

13. The piezoelectric device according to claim 1, wherein said thin-walled region of the ceramic substrate has a thickness which is not greater that 50 μm.

14. The piezoelectric device according to claim 1, wherein said piezoelectric transducer has a thickness which is not more than 100 μm.

* * * * *